United States Patent
Lo et al.

(10) Patent No.: US 9,001,031 B2
(45) Date of Patent: Apr. 7, 2015

(54) COMPLEX PASSIVE DESIGN WITH SPECIAL VIA IMPLEMENTATION

(75) Inventors: Chi Shun Lo, San Diego, CA (US); Je-Hsiung Jeffrey Lan, San Diego, CA (US); Mario Francisco Velez, San Diego, CA (US); Robert Paul Mikulka, Oceanside, CA (US); Chengjie Zuo, Santee, CA (US); Changhan Hobie Yun, San Diego, CA (US); Jonghae Kim, Surabaya, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 158 days.

(21) Appl. No.: 13/562,168

(22) Filed: Jul. 30, 2012

(65) Prior Publication Data

US 2014/0028543 A1    Jan. 30, 2014

(51) Int. Cl.
| | | |
|---|---|---|
| *G09G 5/00* | (2006.01) | |
| *H01B 13/00* | (2006.01) | |
| *H01F 17/00* | (2006.01) | |
| *H01F 27/28* | (2006.01) | |
| *H01L 23/522* | (2006.01) | |
| *H01L 49/02* | (2006.01) | |
| *G02B 26/00* | (2006.01) | |

(52) U.S. Cl.
CPC .......... *H01F 17/0006* (2013.01); *G02B 26/001* (2013.01); *H01F 27/2804* (2013.01); *H01L 23/5227* (2013.01); *H01L 28/10* (2013.01); *H01L 2924/00* (2013.01); *H01L 2924/0002* (2013.01)

(58) Field of Classification Search
USPC ........ 345/156; 336/200; 361/679.21; 427/58, 427/123; 216/18
See application file for complete search history.

(56) References Cited

U.S. PATENT DOCUMENTS

| | | | |
|---|---|---|---|
| 6,477,031 B1 * | 11/2002 | Hayashi | ............ 361/306.3 |
| 7,068,138 B2 | 6/2006 | Edelstein et al. | |
| 7,339,277 B2 | 3/2008 | Shioga et al. | |
| 7,638,406 B2 | 12/2009 | Edelstein et al. | |
| 7,678,639 B2 | 3/2010 | Harris et al. | |
| 7,867,832 B2 * | 1/2011 | Yang et al. | ............ 438/132 |
| 7,943,412 B2 | 5/2011 | Buchwalter et al. | |
| 8,058,960 B2 | 11/2011 | Hebert et al. | |

(Continued)

FOREIGN PATENT DOCUMENTS

EP    1320122 A2    6/2003

OTHER PUBLICATIONS

International Search Report and Written Opinion—PCT/US2013/050874, International Search Authority—European Patent Office, Dec. 10, 2013.

(Continued)

*Primary Examiner* — Waseem Moorad
(74) *Attorney, Agent, or Firm* — Weaver Austin Villeneuve & Sampson LLP

(57) ABSTRACT

This disclosure provides systems, methods and apparatus for vias in an integrated circuit structure such as a passive device. In one aspect, an integrated passive device includes a first conductive trace and a second conductive trace over the first conductive trace with an interlayer dielectric between a portion of the first conductive trace and the second conductive trace. One or more vias are provided within the interlayer dielectric to provide electrical connection between the first conductive trace and the second conductive trace. A width of the vias is greater than a width of at least one of the conductive traces.

34 Claims, 12 Drawing Sheets

(56) References Cited

U.S. PATENT DOCUMENTS

2003/0222295 A1   12/2003   Lin
2007/0126543 A1   6/2007   Yeh et al.
2009/0146770 A1   6/2009   Lee et al.
2009/0322447 A1*  12/2009   Daley et al. .................. 333/185
2011/0063815 A1   3/2011   Lu et al.

OTHER PUBLICATIONS

Partial International Search Report—PCT/US2013/050874—ISA/EPO—Oct. 2, 2013.

* cited by examiner

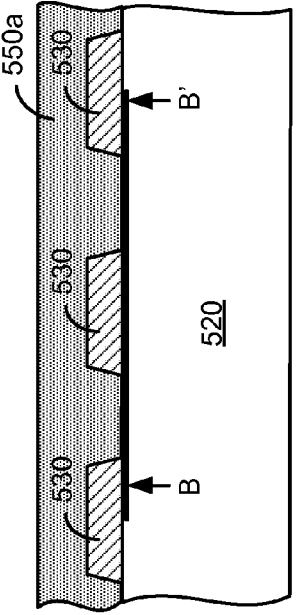
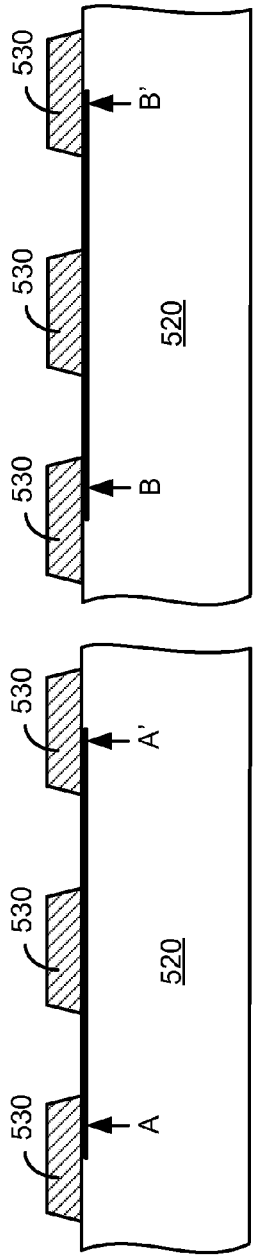
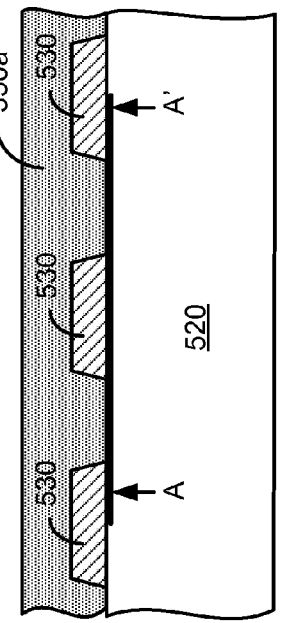
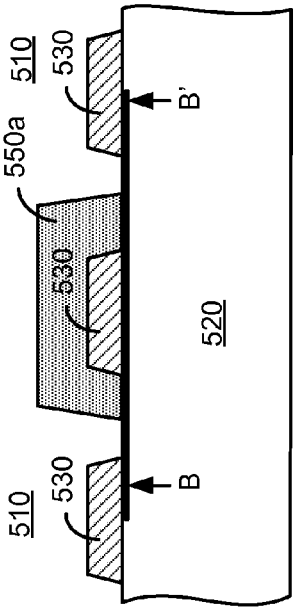
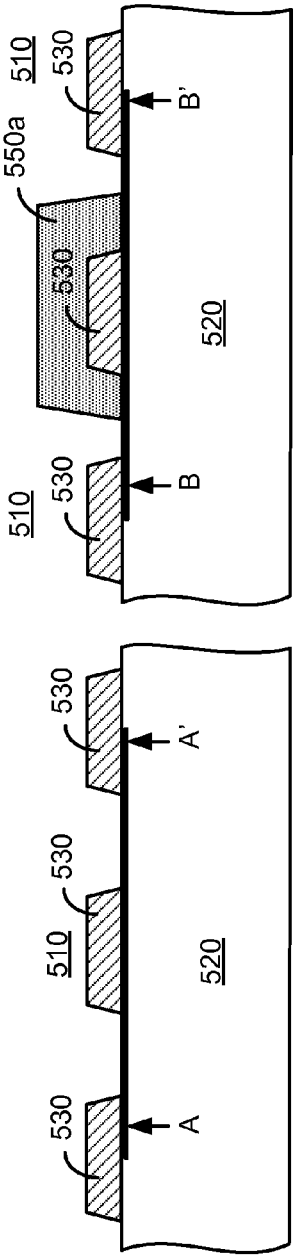
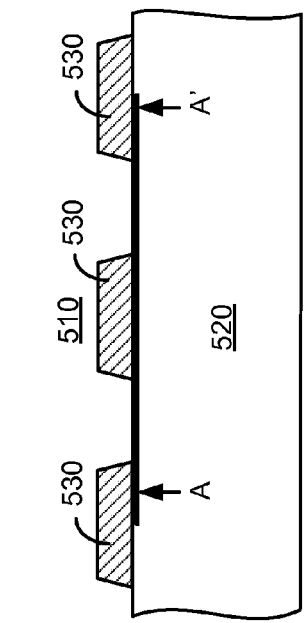

COMPLEX PASSIVE DESIGN WITH SPECIAL VIA IMPLEMENTATION

TECHNICAL FIELD

This disclosure relates generally to vias in integrated circuit devices, and more particularly to integrated passive devices.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

Vias and conductive traces may be used to electrically connect EMS devices to one another or to other components, such as passive components. For example, vias and conductive traces may allow electrical connection between different layers of material that are included in EMS devices on a substrate.

SUMMARY

The systems, methods and devices of this disclosure each have several innovative aspects, no single one of which is solely responsible for the desirable attributes disclosed herein.

One innovative aspect of the subject matter described in this disclosure can be implemented in an integrated passive device. The device includes a substrate, a first conductive trace over the substrate, a second conductive trace over the first conductive trace, and an interlayer dielectric disposed between a portion of the first conductive trace and the second conductive trace. The interlayer dielectric has one or more vias formed therein, where a width of the vias is greater than a width of at least one of the conductive traces, and the one or more vias provide electrical connection between the conductive traces.

In some implementations, the one or more vias can enclose at least a portion of the first conductive trace not in contact with the interlayer dielectric. In some implementations, the second conductive trace can include copper. In some implementations, a thickness of the second conductive trace can be greater than about 1 µm. In some implementations, the second conductive trace can form part of a magnetic domain passive component. The magnetic domain passive component can be one of an inductor, transformer and a passive filter.

Another innovative aspect of the subject matter described in this disclosure can be implemented in an integrated passive device. The device includes a substrate, first means for conducting electricity positioned over the substrate, second means for conducting electricity positioned over the first conducting means, means for electrically isolating the first conducting means and the second conducting means positioned between a portion of the first conducting means and the second conducting means, and means for providing electrical connection between the first conducting means and the second conducting means in the electrically isolating means. The providing electrical connection means encloses at least a portion of the first conducting means not in contact with the electrically isolating means.

In some implementations, the providing electrical connection means can have a width greater than a width of at least one of the conducting means. In some implementations, the second conducting means can include copper. In some implementations, the device can further include a means for providing electrical insulation over the second conducting means.

Another innovative aspect of the subject matter described in this disclosure can be implemented in a method of manufacturing an integrated passive device. The method includes providing a substrate, depositing a first conductive trace over the substrate, depositing a first interlayer dielectric over the first conductive trace, forming one or more vias in the first interlayer dielectric, depositing a second conductive trace over the first conductive trace, and depositing a second interlayer dielectric over the second conductive trace. A width of the one or more vias is greater than a width of at least one of the conductive traces, the one or more vias providing electrical connection between the conductive traces.

In some implementations, forming the one or more vias can include enclosing portions of the first conductive trace not in contact with the first interlayer dielectric. In some implementations, depositing the second conductive trace can include electroplating copper over the first conductive trace. In some implementations, depositing the second conductive trace and the second interlayer dielectric can occur under coarse process control constraints.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays, organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

FIGS. 5A-1 through 5A-5 show examples of cross-sections illustrating a method of manufacturing the complex geometric passive device in FIG. 5 along cross-section A-A.

FIGS. 5B-1 through 5B-5 show examples of cross-sections illustrating a method of manufacturing the complex geometric passive device in FIG. 5 along cross-section B-B.

Like reference numbers and designations in the various drawings indicate like elements.

DETAILED DESCRIPTION

Figure 1A:
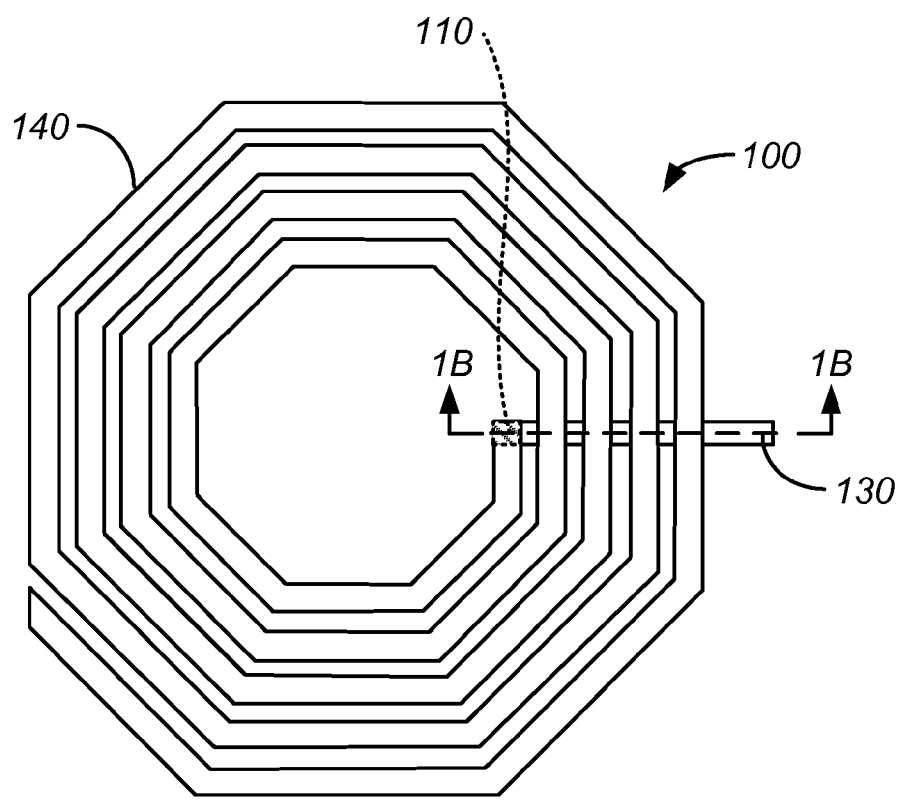
FIG. 1A shows an example of a top view of a simple geometric passive device with a via according to some implementations.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Some implementations described herein relate to vias for providing electrical interconnection between conductive traces in devices associated with a substrate, such as integrated passive devices. The integrated passive device can include magnetic domain passive components, including but not limited to inductors, transformers, and passive filters. Any of these passive devices can have simple or complex geometries. A simple passive device may have any number of nets, where nets can be defined as connections between components. Each net can contain one or fewer top conductive traces, one or fewer bottom conductive traces, and one or fewer vias in a dielectric layer. Otherwise, the passive device is generally a complex passive component. The integrated passive device can include a substrate, a first conductive trace over the substrate, and a second conductive trace over the first conductive trace. An interlayer dielectric can be disposed between a portion of the first conductive trace and the second conductive trace. One or more vias can be formed in the interlayer dielectric to provide electrical connection between the first and the second conductive trace. A width of the one or more vias is greater than a width of one or both of the conductive traces. In some implementations, the one or more vias enclose at least a portion of the first conductive trace not in contact with the interlayer dielectric.

Particular implementations of the subject matter described in this disclosure can be implemented to realize one or more of the following potential advantages. Implementing vias each with a width greater than a width of one or both of the conductive traces allows for passive components with complex geometries to be manufactured using coarser design constraints. Passive components made with coarser design constraints include passive components having thick metal/thick dielectric layers, such as copper redistribution layers (RDL). Such components typically have a high quality (Q) factor. Hence, using vias each with a width greater than a width of one or both of the conductive traces permits the manufacture of complex passive components with high Q factors. As a result, such a via configuration for thick metal/thick dielectric layers can improve electrical performance relative to back-end-of-line (BEOL) layers. Moreover, the via configuration increases flexibility in designing passive components, including complex geometric passive components. In addition, the via configuration can reduce costs by using a coarse controlled process. The low-cost coarse controlled process avoids complex process flows in BEOL layers, while permitting assembly in post-passivation processing in far-back-end-of-line (FBEOL) layers.

An example of a suitable EMS or MEMS device or apparatus, to which the described implementations may apply, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector that is movable with respect to the absorber, and an optical resonant cavity defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

The continued miniaturization of integrated circuits has been accompanied by an expectation of decreasing cost. However, while the footprint of active components has shrunk, passive components in integrated circuits have generally not decreased in area, resulting in a high cost per unit area for passive circuitry. Passive components, such as resistors, capacitors, and inductors, can help to stabilize electrical performance in integrated circuits. Such passive components can be implemented with circuitry in EMS devices and integrated circuits, including radio-frequency integrated circuits (RFICs).

The performance of an inductor or other passive components relates to the quality (Q) factor, which can be expressed by $Q=\omega_0 L/R$, where $\omega_0$ is the resonant frequency, L is the inductive value, and R is the resistance. Resistance is inversely proportional to the conductivity of the material and the cross-sectional area of material. Thus, one way to improve the Q factor is to increase the thickness of the metal, or to use metal with high conductivity.

Conventionally, many integrated circuits are made using complementary-metal-oxide-semiconductor (CMOS) manufacturing technology because of its relatively low-power, low-cost features. A typical CMOS technology process flow is used to produce passive components. Many passive components are manufactured on-chip through existing back-end-of-line (BEOL) process flows. In some implementations, the passive components are manufactured in a passive-on-glass (POG) configuration. The standard BEOL and POG processes typically operate in sub-micron (such as less than or equal to about 1 μm) lithography and use low conductivity metals, such as aluminum (Al). As a result, such process flows may not have high Q factor performance due to limitations in thin metal deposition and/or low conductivity metals.

Some integrated circuits are being manufactured using thick metal deposition and high conductivity metals, such as copper (Cu). However, thick metals can consume large amounts of integrated circuit space, and suitable areas for high conductivity metals may be limited. Many integrated circuits use far back-end-of-line process flows (FBEOL) that can employ metallization between on-chip and off-chip wiring instead of CMOS lithography. The FBEOL process flows can operate in greater than sub-micron constraints, such as greater than or equal to about 10 μm. FBEOL layers can be characterized by under-bump-metal (UBM) or redistribution layers (RDL), such as copper RDL.

Hence, simple passive components formed using FBEOL process flows in thick metal/thick dielectric layers can provide a performance advantage over standard aluminum BEOL or POG layers. However, integrated circuits may not be able to implement complex passive components (e.g., complex inductors, transformers, hybrid transformers, Baluns, passive filters, etc.) on thick metal/thick dielectric layers due to process constraints from a less accurate process control. This is due at least in part to the fact that sub-micron vias for connecting metal layers cannot be fabricated using such a less accurate process control.

FIG. 1A shows an example of a top view of a simple geometric passive device with a via according to some implementations. As illustrated in the example in FIG. 1A, the simple geometric passive device 100 can be a spiral inductor. It will be understood, however, that the passive device 100 is not limited to a spiral inductor, but can include other simple geometries as well. Other simple geometries for the passive device 100 can include a multi-turn inductor, a single-turn inductor, a transformer (e.g., from multiple simple inductors coupled laterally), any circuit built from simple passive components, and any simple interconnection (e.g., connection by a via in the dielectric connecting a top metal with a bottom metal). The passive device 100 can have a via 110 at a terminal end of the spiral inductor. The via 110 provides electrical connection between a top conductive trace 140 and a bottom conductive trace 130. The top conductive trace 140 can form part of a passive component, including but not limited to inductors, resistors, and capacitors. The bottom conductive trace 130 can form part of a metal underpass that provides electrical connection to other devices, such as active devices. In some implementations, the passive device 100 can be formed using precise process constraints (e.g., sub-micron lithography) for a standard BEOL process.

Figure 1B:
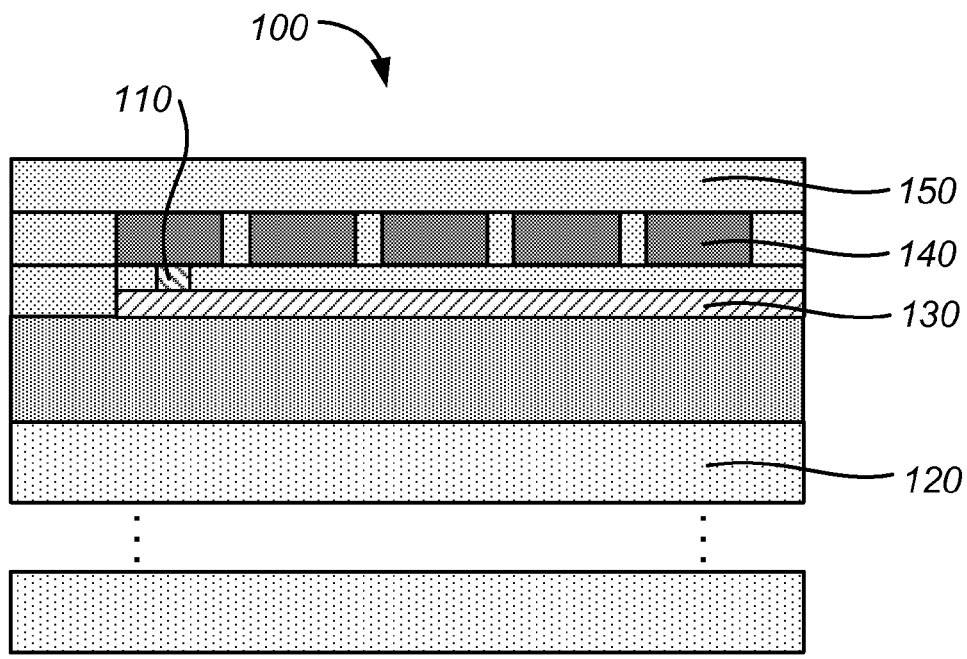
FIG. 1B shows a cross-sectional schematic illustration of the simple geometric passive device in FIG. 1A along cross-section 1B-1B.

FIG. 1B shows a cross-sectional schematic illustration of the simple geometric passive device in FIG. 1A along cross-section 1B-1B. As illustrated in the example in FIG. 1B, the via 110 has a width that is no greater than a width of one or both of the conductive traces 130 and 140. For example, the width of the via 110 can be between about 1 μm and about 5 μm, such as about 3 μm, while the width of the top conductive trace 140 can be between about 5 μm and about 10 μm, such as about 9 μm.

In some implementations, the top conductive trace 140 can include an electrically conductive metal, including but not limited to Al, Cu, silver (Ag), tungsten (W), and alloys and combinations thereof. For example, the top conductive trace 140 can include Al or Al alloys. Al and Al alloys can be deposited by PVD and photolithography (photo and wet/dry etch). In some implementations, the bottom conductive trace 130 also can include an electrically conductive metal, such as Al, Cu, silver (Ag), tungsten (W), and alloys and combinations thereof. In some implementations, the thickness of the conductive traces 130 and 140 is less than or equal to about 1 µm.

An interlayer dielectric 150 can be formed over and between the conductive traces 130 and 140. The interlayer dielectric 150 can electrically insulate the conductive traces 130 and 140. The interlayer dielectric 150 can include any suitable dielectric material such as silicon nitride ($Si_3N_4$), silicon dioxide ($SiO_2$), silicon oxynitride, and polymeric insulators, such as polyimide (PI) and benzocyclobutene (BCB).

The bottom conductive trace 130 can be formed over a substrate 120. The substrate 120 can include a semiconductor or insulating material. For example, the substrate 120 can include silicon (Si), silicon-on-insulator (SOI), germanium (Ge), silicon germanium (SiGe), gallium arsenide (GaAs), gallium arsenide phosphide (GaAsP), indium phosphide (InP), gallium aluminum arsenic (GaAlAs), indium gallium phosphide (InGaP), silicon carbide (SiC), $SiO_2$, glass, and quartz substrate. The substrate 120 can be part of an integrated circuit with one or more active or passive devices formed thereon. In some implementations, the substrate 120 also can include a dielectric layer, which can be a glass material with high resistivity. This can include fused silica, quartz, silicon dioxide, silicate. The dielectric layer also can include silicon nitride, silicon carbide, silicon oxynitride, ceramics, glass ceramics, plastics, polymers, epoxies, and the like.

Figure 2A:
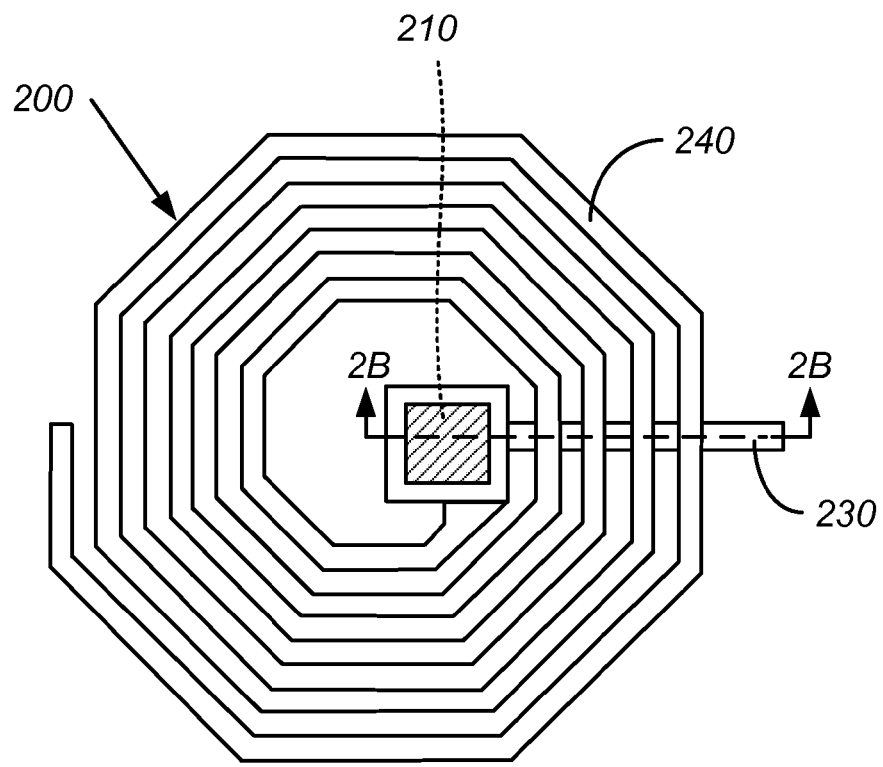
FIG. 2A shows an example of a top view of a simple geometric passive device with a via according to some implementations.

In some implementations, the passive device 100 can be formed as part of a standard BEOL process or POG process. Such processes typically apply more precise design constraints relative to coarser design constraints that can be used in, for example, FBEOL processes. However, simple geometric passive devices also can be manufactured using coarse design constraints in thick metal/thick dielectric layers used in the PCB fabrication, where the minimum feature size, or where the process design rules of line width and line spacing, are typically larger than 10 µm. Process design rules are a series of parameters or constraints provided by semiconductor manufacturers that can establish minimum area, width, spacing, etc. for chip features. For example, a spacing rule specifies the minimum distance between two adjacent objects. A width rule specifies the minimum width of any shape in the design. Such design constraints can verify the correctness of a mask set and ensure sufficient margins to account for variability in fabrication. Thus, for coarse design constraints, minimum feature size or the process design rules of line width and line spacing can be established to be greater than about 10 µm. Such constraints can be applied to processing steps including, for example, patterning (e.g., photolithography), referring to the layout relationship of design features in the same layer or between different layers. FIG. 2A shows an example of a top view of a simple geometric passive device with a via according to some implementations.

In the example in FIG. 2A, the passive device 200 can include a top conductive trace 240 over a bottom conductive trace 230. The top conductive trace 240 can be a spiral inductor over the bottom conductive trace 230, which can be a BEOL underpass. It will be understood, however, that the passive device 200 is not limited to a spiral inductor, but can include other simple geometries as well. Other simple geometries for the passive device 200 can include a multi-turn inductor, a single-turn inductor, a transformer (e.g., from multiple simple inductors coupled laterally), any circuit built from simple passive components, and any simple interconnection (e.g., connection by a via in the dielectric connecting a top metal with a bottom metal). The passive device 200 can have a via 210 at a terminal end of the spiral inductor to provide electrical connection between the top conductive trace 240 and the bottom conductive trace 230. As the via 210 can be formed in thick metal/thick dielectric layers, a width of the via 210 can be wider than in a standard BEOL or POG process. In some implementations, the via 210 can be between about 10 µm and about 75 µm, such as about 35 µm. However, the top conductive trace 240 can have a width greater than the width of the via 210. For example, the width of the top conductive trace 240 can be between 25 µm and 100 µm, such as about 55 µm. In some implementations, the passive device 200 can be formed in coarse process constraints for a FBEOL process.

Figure 2B:
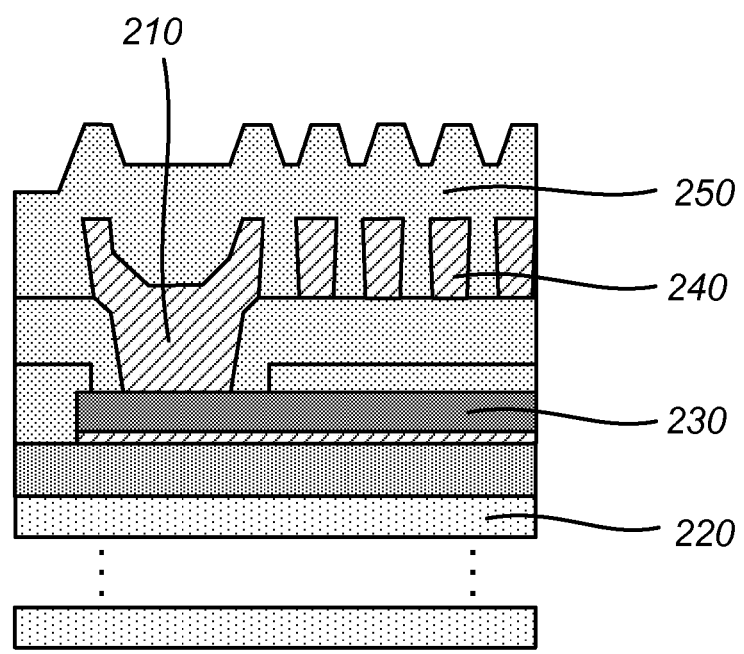
FIG. 2B shows a cross-sectional schematic illustration of the simple geometric passive device in FIG. 2A along cross-section 2B-2B.

FIG. 2B shows a cross-sectional schematic illustration of the simple geometric passive device in FIG. 2A along cross-section 2B-2B. A thickness of the top conductive trace 240 in a thick metal/thick dielectric layer can be substantially larger than the thickness of the top conductive trace 140 in FIG. 1B. For example, the thickness of the top conductive trace 240 can be greater than about 1 µm, for example between about 5 µm and about 10 µm. In some implementations, the top conductive trace 240 can include an electrically conductive metal, such as Cu. The use of Cu provides a relatively high conductivity metal, and increasing the thickness of the Cu provides even more conductivity. Hence, the use of thick Cu can improve the Q factor of the passive device 200 while maintaining a relatively low cost. It is understood that the top conductive trace 240 can include other electrically conductive metals such as Al or Al alloys deposited by PVD and patterned by photolithography (photo and wet/dry etch). The bottom conductive trace 230 can include an electrically conductive metal, such as Al or Al alloy. An interlayer dielectric 250 can be formed over and between the conductive traces 230 and 240 and electrically insulate the conductive traces 230 and 240. The interlayer dielectric 250 can include any suitable dielectric material such as $Si_3N_4$, $SiO_2$, $SiO_xN_y$, and polymeric insulators, such as polyimide and BCB. The bottom conductive trace 230 can be over a substrate 220 having a semiconducting or insulating material as discussed earlier herein. The description of any element over another element as used herein can include processes of laying and/or forming (e.g., depositing, electroplating, etc.) the element over the other element.

Figure 3A:
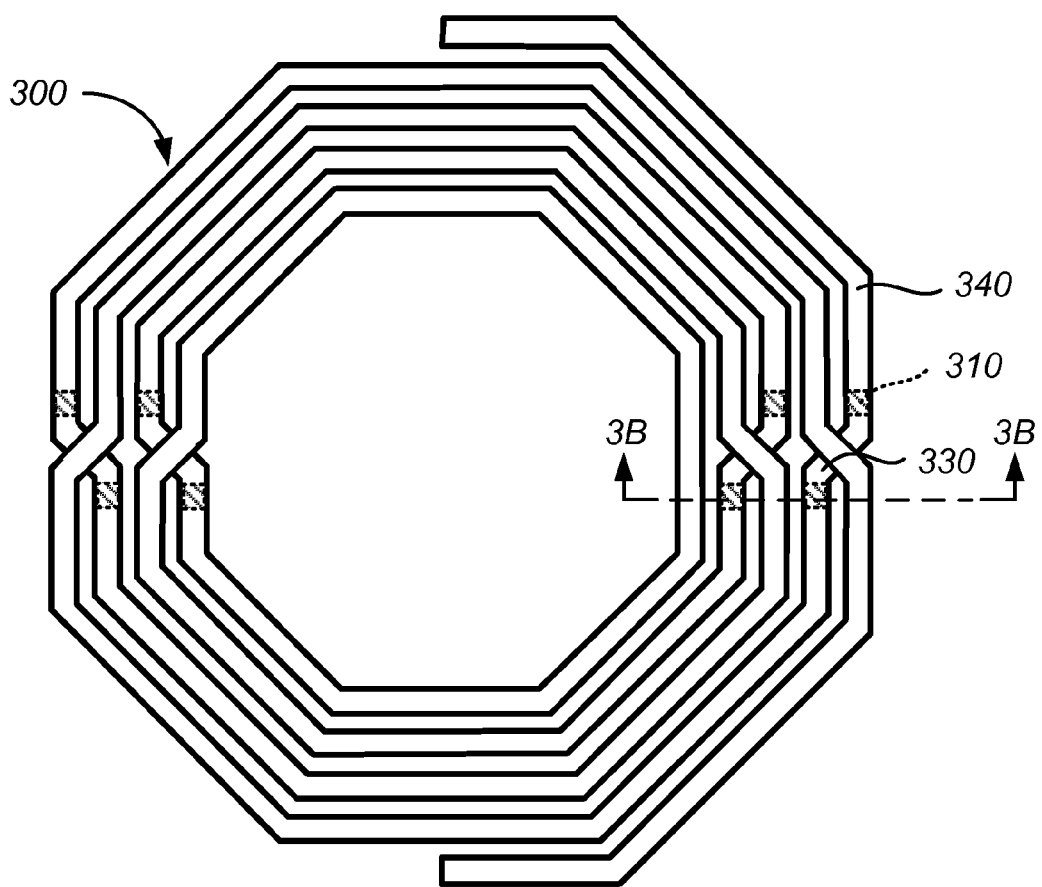
FIG. 3A shows an example of a top view of a complex geometric passive device with a plurality of vias according to some implementations.

While the use of thick Cu from a thick metal/thick dielectric process can improve the electrical performance of the passive device 200, the flexibility of passive devices 200 can be limited to simple geometric passive components. The coarse design constraints for thick metal/thick dielectric processes present challenges to adapting the design constraints to passive components with more complex geometries. A complex geometric passive device can include but is not limited to symmetrical inductors, transformers (e.g., from multiple complex inductors coupled laterally), any circuit that is built using complex passive components, Baluns, resonators, and passive filters. FIG. 3A shows an example of a top view of a complex geometric passive device with a plurality of vias according to some implementations.

In the example in FIG. 3A, the passive device 300 can be a symmetrical inductor with a top conductive trace 340 connected to a bottom conductive trace 330 through vias 310. It will be understood, however, that the passive device 300 is not limited to a symmetrical inductor, but can include other complex geometries as well. The vias 310 can provide electrical connection between the top conductive trace 340 and the bottom conductive trace 330 at multiple points. The symmetrical inductor has the same structure as viewed from any end and can achieve symmetrical loading. The symmetrical inductor can have multiple turns in which the traces cross over. Such turns can reduce the net magnetic field produced by the symmetrical inductor. Each of the turns can include a pair of vias 310 at terminal ends of the top conductive trace 340. In some implementations, the bottom conductive trace 330 can be a wire underpass. In the example in FIG. 3A, the bottom conductive trace 330 can cross underneath the top conductive trace 340 at four separate points and connect through vias 310 at eight separate points. The wire underpass can use substantially less material than the top conductive trace 340. In some implementations, the passive device 300 can be formed with precise process constraints (e.g., sub-micron lithography) for a standard BEOL process.

Figure 3B:
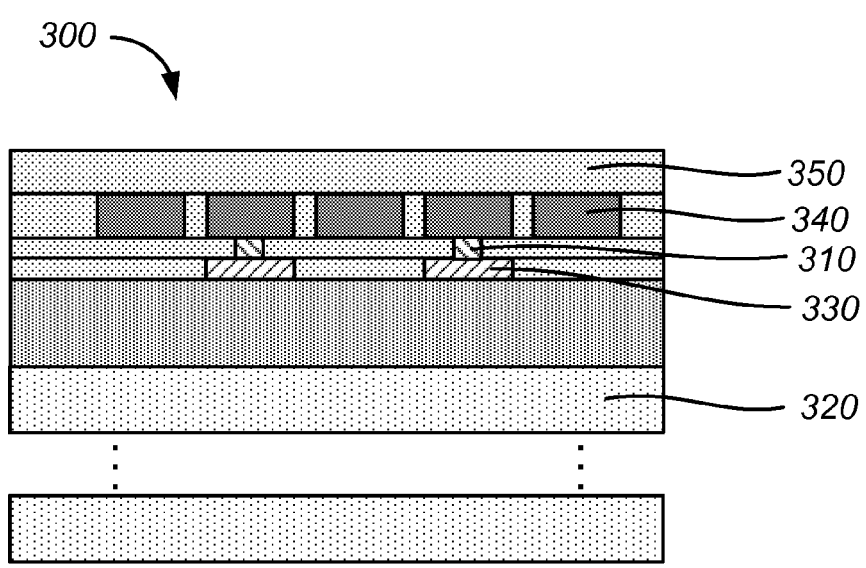
FIG. 3B shows a cross-sectional schematic illustration of the complex geometric passive device in FIG. 3A along cross-section 3B-3B.

FIG. 3B shows a cross-sectional schematic illustration of the complex geometric passive device in FIG. 3A along cross-section 3B-3B. In some implementations, the top conductive trace 340 can include any electrically conductive metal as discussed earlier herein. For example, the top conductive trace 340 can include Al or Al alloy. The bottom conductive trace 330 also can include any electrically conductive metal as discussed earlier herein. For example, the bottom conductive trace 330 also can include Al or Al alloy. In some implementations, the Al or Al alloy can be formed by PVD and photolithography for both the bottom and top conductive traces 330 and 340. An interlayer dielectric 350 can be formed over and between the conductive traces 330 and 340. The interlayer dielectric 350 can electrically insulate the conductive traces 330 and 340. The interlayer dielectric 350 can include any suitable dielectric material such as $Si_3N_4$, $SiO_2$, $SiO_xN_y$, and polymeric insulators, such as polyimide and BCB. As illustrated in the example in FIG. 3B, the vias 310 have a width that is no greater than a width of one or both of the conductive traces 330 and 340. For example, the width of the vias 310 can be between about 1 μm and about 5 μm, such as about 3 μm, while the width of the top conductive trace 340 can be between about 5 μm and about 10 μm, such as about 9 μm. In some implementations, a thickness of the conductive traces 330 and 340 is less than or equal to about 1 μm. The bottom conductive trace 330 can be formed over a substrate 320 having a semiconductor material or insulating material as discussed earlier herein.

Complex geometric passive devices can be manufactured in on-chip BEOL processes using precise process constraints (e.g., sub-micron lithography). Some complex geometric passive devices can be configured in implementations as illustrated in the example in FIGS. 3A and 3B. However, such complex geometric passive devices can be limited in electrical performance in terms of metal/dielectric material and thickness. To achieve higher electrical performance, the complex geometric passive device can be formed in a thick metal/thick dielectric layer. Hence, it may be desirable to form complex geometric passive devices using coarse process constraints in a FBEOL process. However, if the complex passive device retains a relatively small form factor (e.g., narrow trace widths), and the via is formed with a relatively high form factor (e.g., wide via width), then the coarse process constraints may be incompatible with forming a complex geometric passive device.

Figure 4A:
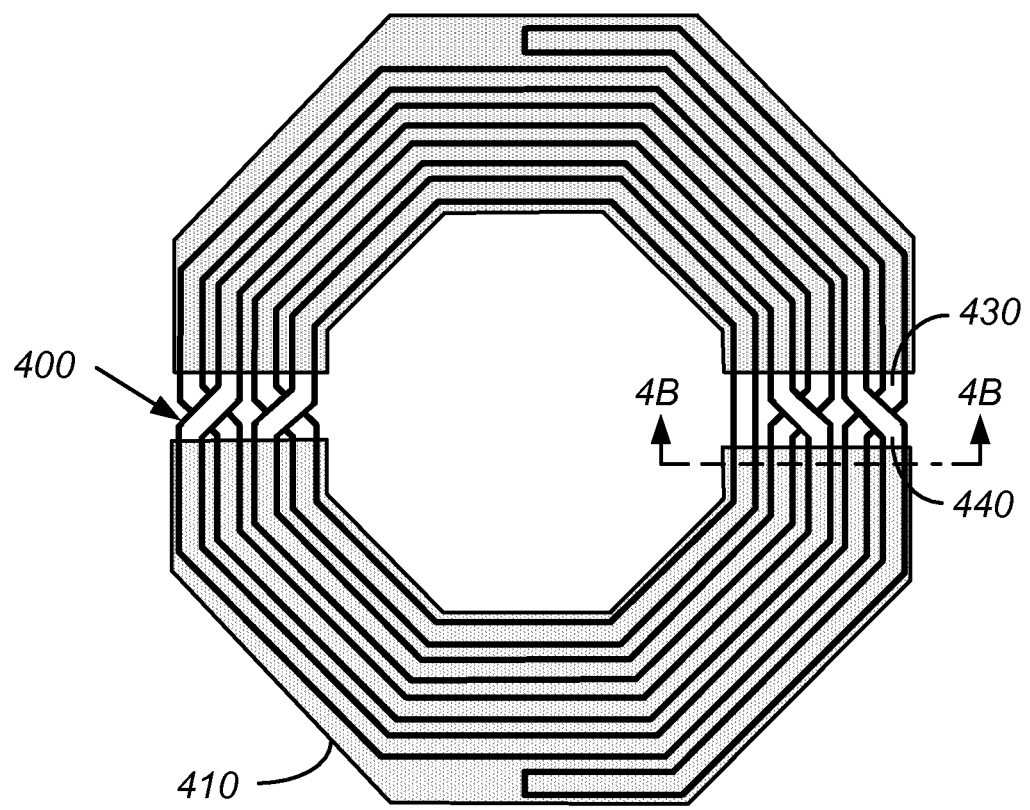
FIG. 4A shows an example of a top view of a complex geometric passive device with a via design according to some implementations.

In some implementations, a complex passive device can be formed using coarse process constraints. FIG. 4A shows an example of a top view of a complex geometric passive device with a via design according to some implementations. The passive device 400 can be a symmetrical inductor with a top conductive trace 440 connected to a bottom conductive trace 430 through vias 410. The vias 410 have a width greater than a width of one or both of the top conductive trace 440 and the bottom conductive trace 430. In some implementations, the width of the vias can be greater than about 5 times the width of one or both of the top conductive trace 440 and the bottom conductive trace 430. In some implementations, as illustrated in the example in FIG. 4A, the vias 410 are substantially all around and throughout the passive device 400. The vias 410 can provide electrical connection between the top conductive trace 440 and the bottom conductive trace 430 throughout the passive device 400 except at turns where the top conductive trace 440 crosses over the bottom conductive trace 430. At turns in the symmetrical inductor, the top conductive trace 440 can be electrically isolated from the bottom conductive trace 430. In some implementations, the vias 410 can connect multiple conductive traces in multiple layers. In some implementations, the bottom conductive trace 430 can be substantially coextensive with the top conductive trace 440.

It will be understood that the process constraint of having the width of the vias 410 greater than the width of one or both of the conductive traces 430 and 440 is not limited to complex geometric passive devices only, but can be implemented in simple geometric passive devices as well, such as spiral inductors.

The top conductive trace 440 can form part of a passive component and the bottom conductive trace 430 also can form part of a passive component. For magnetic domain passive components, the magnetic material can be deposited by coating the surface of the top conductive trace 440 and/or bottom conductive trace 430 with magnetic material. In some implementations, the magnetic material can be deposited by embedding the material in a part of an interlayer dielectric near the passive component.

Figure 4B:
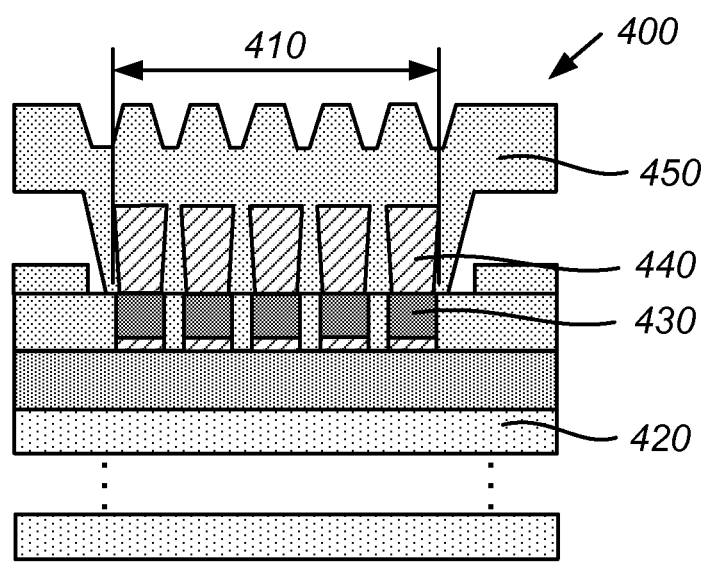
FIG. 4B shows a cross-sectional schematic illustration of the complex geometric passive device in FIG. 4A along cross-section 4B-4B.

FIG. 4B shows a cross-sectional schematic illustration of the complex geometric passive device in FIG. 4A along cross-section 4B-4B. The bottom conductive trace 430 can be over a substrate 420. The bottom conductive trace 430 can be a BEOL layer and made of metals such as Al or Al alloy. In some implementations, the bottom conductive trace 430 can have a thickness between about 1 μm and about 5 μm.

The top conductive trace 440 can be over the bottom conductive trace 430. In the cross-section of FIG. 4B, the top conductive trace 440 is directly over and in contact with the first conductive trace 430. The top conductive trace 440 can be a FBEOL layer and made of a high conductivity metal, such as Cu. It is understood that both the bottom conductive trace 430 and the top conductive trace 440 can be made of Al or Al alloy, such as Al or Al alloy formed by PVD and photolithography. In some implementations, the top conductive trace 440 is part of a copper RDL layer. In some implementations, the top conductive trace 440 can have a thickness greater than about 1 μm, such as between about 5 μm and about 10 μm.

An interlayer dielectric 450 can be over the top conductive trace 440 and the bottom conductive trace 430. In some implementations, the interlayer dielectric 450 can be a polymeric insulator, including but not limited to polyimide, BCB, polynorborene, polytetrafluoroethylene (PTFE), and polyvinylidene fluoride/trifluoroethylene copolymers. In some implementations, the interlayer dielectric 450 can be made of an inorganic material, including but not limited to $SiO_2$ and SiON. In some implementations, the interlayer dielectric 450 can have a thickness between about 1 μm and about 15 μm as measured from the top surface of the top conductive trace 440.

As illustrated in the cross-section of FIG. 4B, the via 410 spans over and encloses the top surface of the bottom conductive trace 430. Put another way, the via 410 laterally extends beyond the edges of the conductive traces 430 and 440. The width of the via 410 is greater than the width of one or both of the conductive traces 430 or 440. In some implementations, the width of the via is between about 25 µm and about 100 µm, whereas the width of the conductive traces can be between about 5 µm and about 15 µm. The via 410 is formed as one or more holes in the interlayer dielectric 450, and the top conductive trace 440 can be formed within the one or more holes in the interlayer dielectric 450. Hence, the top conductive trace 440 can be fully connected and in direct electrical contact with the bottom conductive trace 430 in the cross-section of FIG. 4B. The bottom conductive trace 430 can be over a substrate 420, which can be made of a semiconducting or insulating material as discussed earlier herein.

Figure 4C:
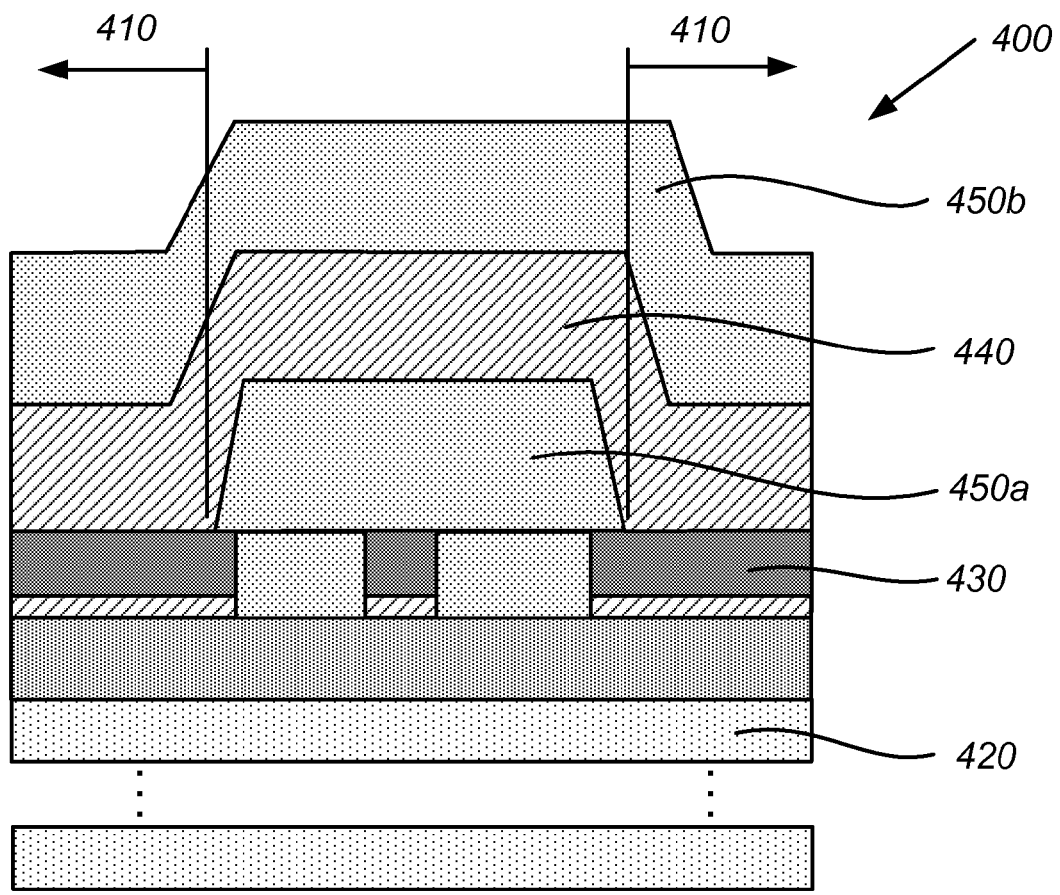
FIG. 4C shows a cross-sectional schematic illustration of the complex geometric passive device in FIG. 4A along cross-section 4C-4C.

FIG. 4C shows a cross-sectional schematic illustration of the complex geometric passive device in FIG. 4A along cross-section 4C-4C. The bottom conductive trace 430 can be over the substrate 420. The top conductive trace 440 can be over the bottom conductive trace 430. A top interlayer dielectric 450b can be over the top conductive trace 440. However, as illustrated in the cross-section of FIG. 4C, a bottom interlayer dielectric or interlayer dielectric island 450a can be between a portion of the bottom conductive trace 430 and the top conductive trace 440. Thus, the top conductive trace 440 can be in direct contact with the bottom conductive trace 430 where the bottom conductive trace 430 is not in contact with the interlayer dielectric island 450a. The interlayer dielectric island 450a electrically isolates a portion of the bottom conductive trace 430 from the top conductive trace 440. In some implementations, the interlayer dielectric island 450a can have a thickness between about 1 µm and about 5 µm.

The via 410 provides electrical connection between the top conductive trace 440 and the bottom conductive trace 430 throughout the passive device 400 except for where the interlayer dielectric island 450a separates the top conductive trace 440 from the bottom conductive trace 430. In other words, the top conductive trace 440 and the bottom conductive trace 430 are fully connected everywhere except where they are electrically isolated by the interlayer dielectric island 450a. Therefore, the via 410 is everywhere where the top conductive trace 440 is connected with the bottom conductive trace 430.

If a via can be implemented to provide electrical interconnection between conductive traces while having a width greater than a width of one or both of the conductive traces, then a complex geometric passive device can be formed using coarse process constraints. Hence, the via design can permit the manufacture of complex geometric passive devices with FBEOL process flow. This can further permit an assembly supplier to package complex geometric passive devices after the passivation process is completed. The process flow for designing such a via can explained in further detail below.

Figure 5:
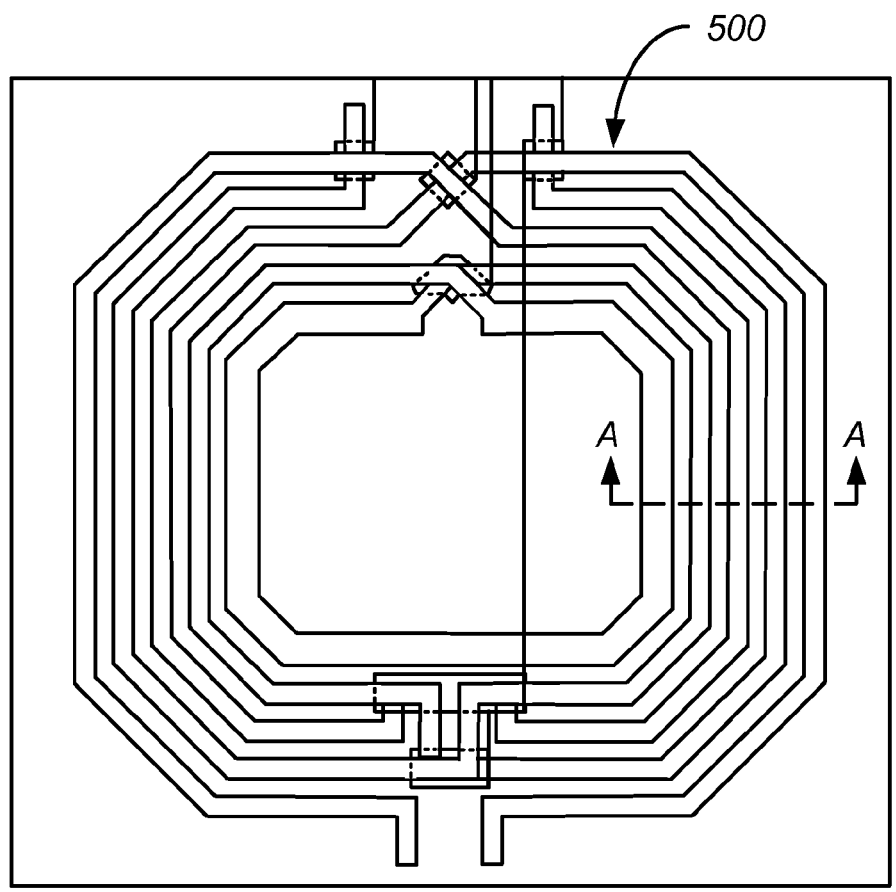
FIG. 5 shows an example of a top view of a complex geometric passive device with a via design according to some implementations.
Figure 5:
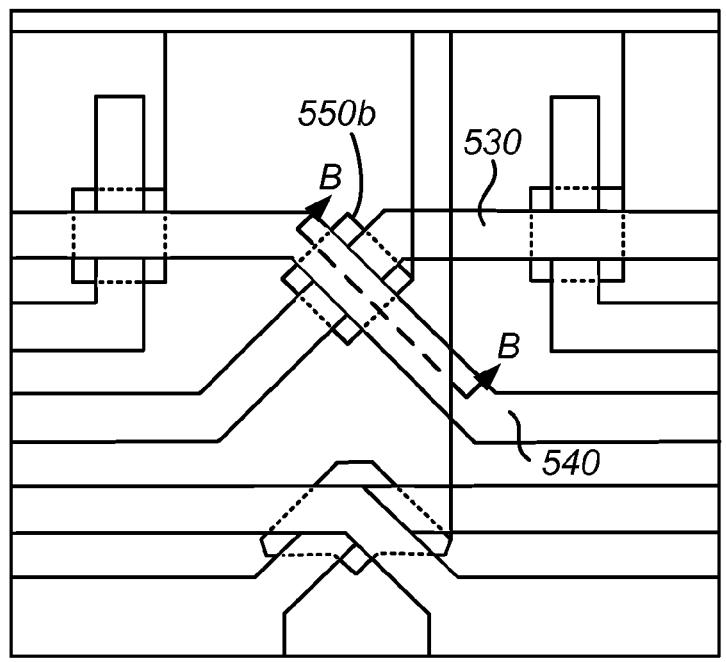

FIG. 5 shows an example of a top view of a complex geometric passive device with a via design according to some implementations. The complex geometric passive device 500 can be a transformer. However, it will be understood that the passive device 500 is not limited to a transformer, but can include other complex geometries as well. Cross-section A-A illustrates a portion of the passive device 500 where the top conductive trace and the bottom conductive trace are co-extensive with each other. Cross-section B-B illustrates a portion of the passive device 500 at a turn where the top conductive trace crosses over the bottom conductive trace.

Figures 4, 5A:
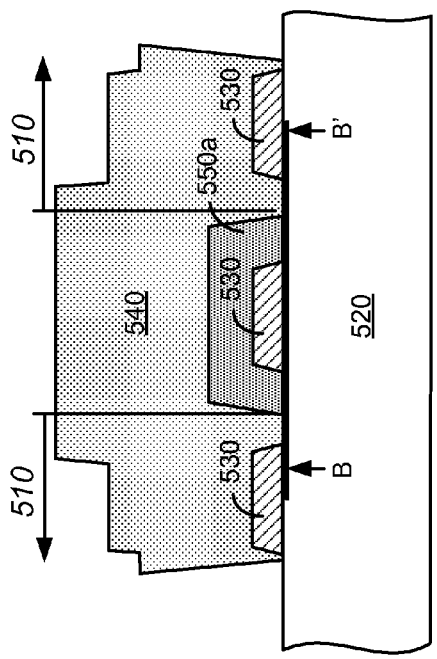
Figures 5, 5A:
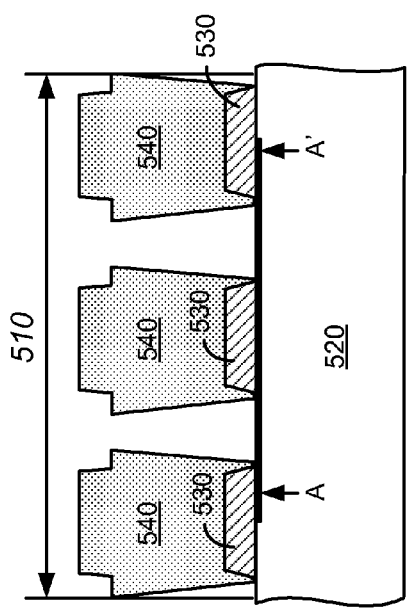
Figures 4, 5B:
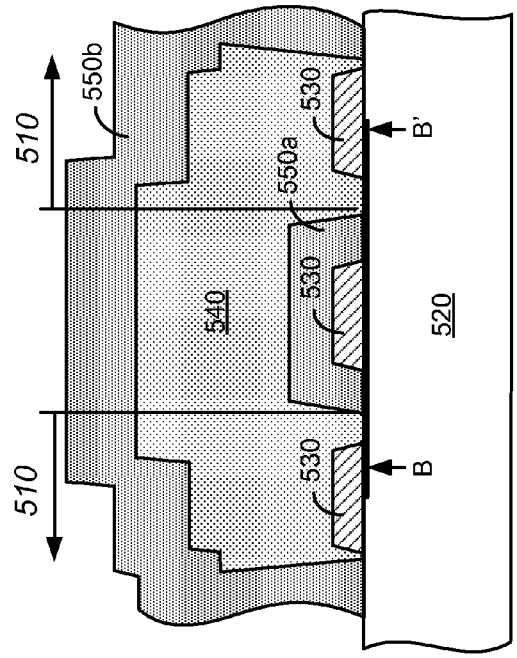
Figures 5, 5B:
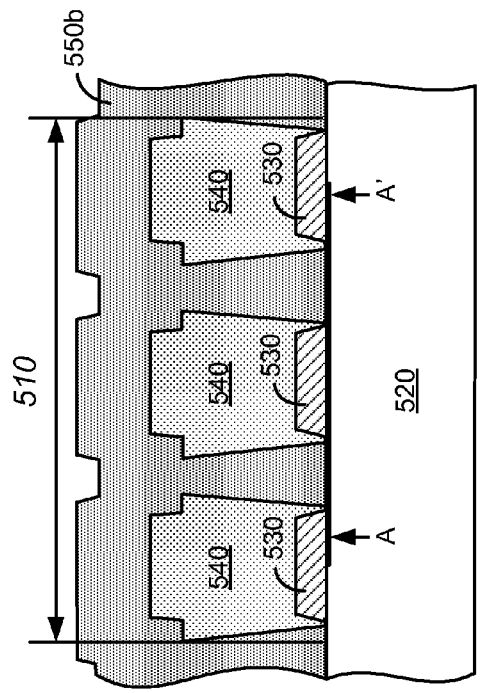

FIGS. 5A-1 through 5A-5 show examples of cross-sections illustrating a method of manufacturing the complex geometric passive device in FIG. 5 along cross-section A-A. FIGS. 5B-1 through 5B-5 show examples of cross-sections illustrating a method of manufacturing the complex geometric passive device in FIG. 5 along cross-section B-B. In FIGS. 5A-1 and 5B-1, a first conductive trace 530 can be deposited over a substrate 520. The first conductive trace 530 can be deposited using any suitable deposition techniques known in the art, such as physical vapor deposition (PVD, e.g., sputtering), plasma-enhanced chemical vapor deposition (PECVD), thermal chemical vapor deposition (thermal CVD), atomic layer deposition (ALD), electroplating, or spin-coating. The first conductive trace 530 can be patterned and etched to form a series of BEOL metal lines or portions. In some implementations, the first conductive trace 530 can be made of Al or Al alloy, such as aluminum copper (AlCu) or aluminum silicon copper (AlSiCu). In some implementations, a thickness of the first conductive trace 530 can be between about 1 µm and about 5 µm.

In FIGS. 5A-2 and 5B-2, a first interlayer dielectric 550a can be deposited over the first conductive trace 530 and the substrate 520. The first interlayer dielectric 550a can be deposited using any suitable deposition techniques known in the art, such as PVD, PECVD, thermal CVD, ALD, or spin-coating. A thickness of the interlayer dielectric layer 550a can be between about 1 µm and about 5 µm as measured from the top surface of the first conductive trace 530. As discussed herein, the interlayer dielectric 550a can include any appropriate dielectric material, including but not limited to polymeric insulators. In some implementations, the interlayer dielectric 550a can include polyimide or BCB.

In FIGS. 5A-3 and 5B-3, the interlayer dielectric 550a can be patterned and etched. Etching the interlayer dielectric 550a removes portions of the interlayer dielectric 550a to form a via 510. Typically, a via is formed by etching a narrow hole in an interlayer dielectric to provide a conductive pathway between two conductive traces. Such a via has a width less than a width of one or both of the conductive traces. Here, the via 510 is formed by etching all around the first conductive trace 530 except for an isolated portion in cross-section B-B. Etching around the first conductive trace 530 exposes at least the top surface of first conductive trace 530. Portions of the interlayer dielectric 550a are etched so that the via 510 has a width greater than a width of one or both of the conductive traces 530 and 540. In fact, the via 510 can enclose the top surface of the first conductive trace 530 except for the isolated portion in cross-section B-B. Accordingly, the via 510 can be formed under coarse process constraints in thick metal/thick dielectric layers.

In FIGS. 5A-4 and 5B-4, a second conductive trace 540 can be deposited over the first conductive trace 530. In some implementations, the second conductive trace 540 can be deposited using any suitable techniques known in the art as discussed earlier herein. For example, the second conductive trace 540 can be deposited by electroplating. In some implementations, as illustrated in FIG. 5A-4, the second conductive trace 540 can be patterned and etched to align directly over the first conductive trace 530. In some implementations, the second conductive trace 540 can be patterned and etched to form a series of copper RDL lines or portions. The copper RDL lines can form part of a complex geometric passive device, such as a transformer. The second conductive trace 540 can be deposited in the via 510 so as to be in direct electrical contact with the first conductive trace 530. In FIG. 5B-4, the second conductive trace 540 can be deposited over the remaining interlayer dielectric 550a and the first conductive trace 530.

In some implementations, the second conductive trace 540 is deposited by electroplating of Cu. A thickness of the Cu can be greater than about 1 µm, such as between about 5 µm and about 10 µm, as measured from the top surface of the first conductive trace 530. It is understood, however, that the second conductive trace 540 can be deposited by PVD and patterned by photolithography of Al or Al alloy.

In FIGS. 5A-5 and 5B-5, a second interlayer dielectric 550b is deposited over the second conductive trace 540. The second interlayer dielectric 550b can be deposited using any known deposition techniques as discussed earlier herein. The second interlayer dielectric 550b can be made of any appropriate dielectric material, including but not limited to polymeric insulators. In some implementations, a thickness of the second interlayer dielectric 550b can be between about 1 μm and about 10 μm, such as about 5 μm.

Figure 6:
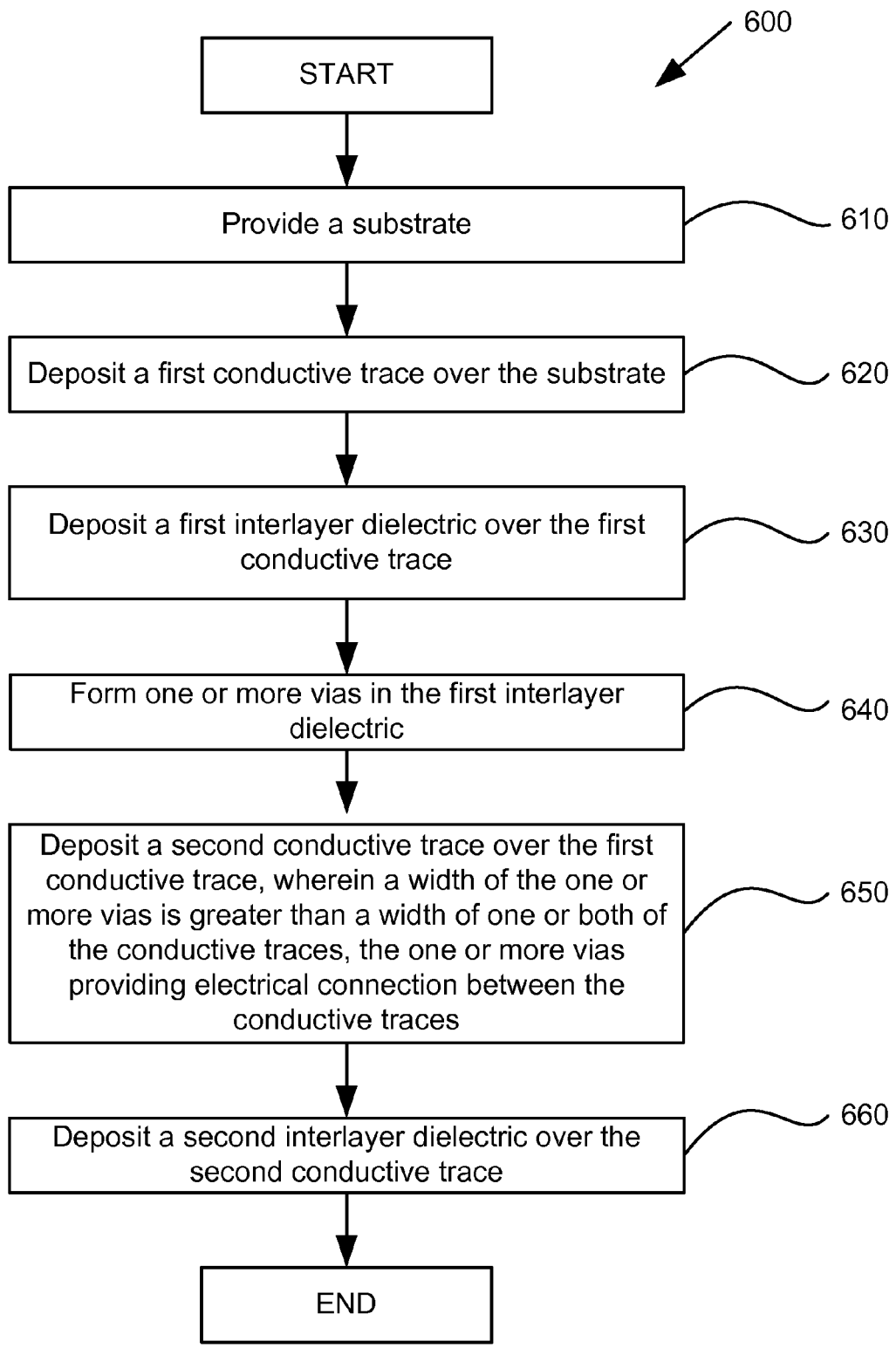
FIG. 6 shows an example of a flow diagram of a method of manufacturing an integrated passive device.

FIG. 6 shows an example of a flow diagram of a method of manufacturing an integrated passive device. It will be understood that additional processes may be present. For example, deposition of underlying or overlying layers can be achieved by various film deposition processes, such as PVD, PECVD, thermal CVD, ALD, spin-on coating, and electroplating. Doping processes, such as diffusion and implantation, can be used to add impurities in a semiconductor material to achieve desired conductivity. Patterning techniques, such as photolithography, can be used to transfer patterns on a mask to a layer of material. Etching processes can be performed after patterning to remove unwanted materials. Planarization processes such as "etch back" and chemical mechanical polishing (CMP) can be employed to create a substantially flat surface for further processing.

The process 600 begins at block 610 where a substrate is provided. As discussed earlier herein, the substrate can formed of a semiconducting or insulating material, including but not limited to Si, SOI, Ge, SiGe, GaAs, GaAsP, InP, GaAlAs, InGaP, SiC, $SiO_2$, glass, and quartz substrate. In some implementations, the substrate also can include a dielectric layer, which can be a glass material with high resistivity. This can include fused silica, quartz, silicon dioxide, silicate. The dielectric layer also can include silicon nitride, silicon carbide, silicon oxynitride, ceramics, glass ceramics, plastics, polymers, epoxies, and the like.

The process 600 continues at block 620 where a first conductive trace is deposited over the substrate. Various process flows can be performed to form the first conductive trace, including the deposition, patterning, etching, and/or planarization processes discussed above. The first conductive trace can be deposited in the BEOL layers of an integrated circuit. In some implementations, the first conductive trace can include Al, Cu, Ag, W, and alloys and combinations thereof.

The process 600 continues at block 630 where a first interlayer dielectric is deposited over the first conductive trace. The first interlayer dielectric can serve to electrically isolate conductive traces. In some implementations, the first interlayer dielectric can include $Si_3N_4$, $SiO_2$, $SiO_xN_y$, and polymeric insulators, such as polyimide and BCB.

The process 600 continues at block 640 where one or more vias are formed in the first interlayer dielectric. The one or more vias can be holes in the first interlayer dielectric. The one or more vias can be formed by patterning and etching the first interlayer dielectric using techniques known in the art. The one or more vias can form trenches around the first conductive trace within the first interlayer dielectric. In some implementations, the one or more vias can enclose portions of the first conductive trace that are not in contact with the first interlayer dielectric.

The process 600 continues at block 650 where a second conductive trace is deposited over the first conductive trace. The width of the one or more vias is greater than either of the conductive traces, and provides electrical connection between the conductive traces. The second conductive trace is deposited in the one or more vias formed within the first interlayer dielectric. The second conductive trace can be fully connected with the first conductive trace everywhere except for where the first interlayer dielectric electrically isolates a portion of the first conductive trace from the second conductive trace. In some implementations, depositing the second conductive trace occurs under coarse process conditions for a thick metal/thick dielectric layer, such as a copper RDL layer. Depositing the second conductive trace can form part of a magnetic domain passive component, such as an inductor, transformer, or passive filter. In some implementations, the second conductive trace can include Cu or Cu alloys, Al or Al alloys, or other suitable metals.

The process 600 continues at block 660 where a second interlayer dielectric is deposited over the second conductive trace. The second interlayer dielectric can serve as an electrical insulator from other circuitry in the integrated circuit device. In some implementations, the second interlayer dielectric can include $Si_3N_4$, $SiO_2$, $SiO_xN_y$, and polymeric insulators, such as polyimide and BCB. In some implementations, contact openings may be formed through the dielectric to allow for electrical connections to be made from the passive device to other components in the integrated circuit device.

Figure 7:
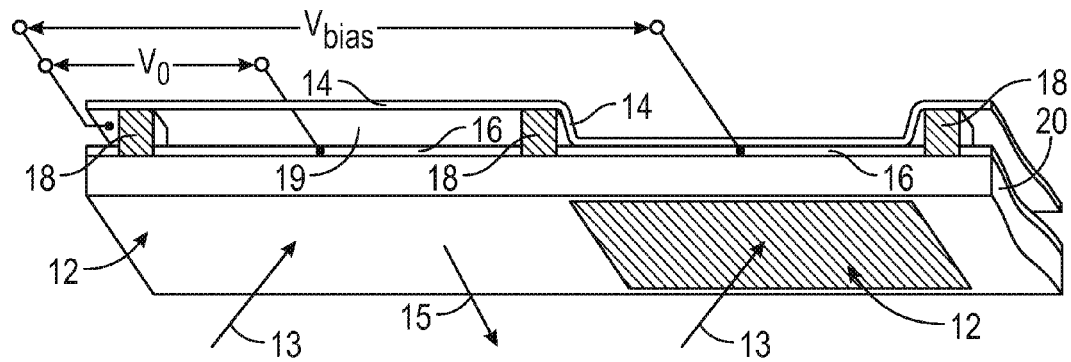
FIG. 7 is an isometric view illustration depicting two adjacent interferometric modulator (IMOD) display elements in a series or array of display elements of an IMOD display device.

FIG. 7 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 7 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 7, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 7 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 7, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 7. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 8:
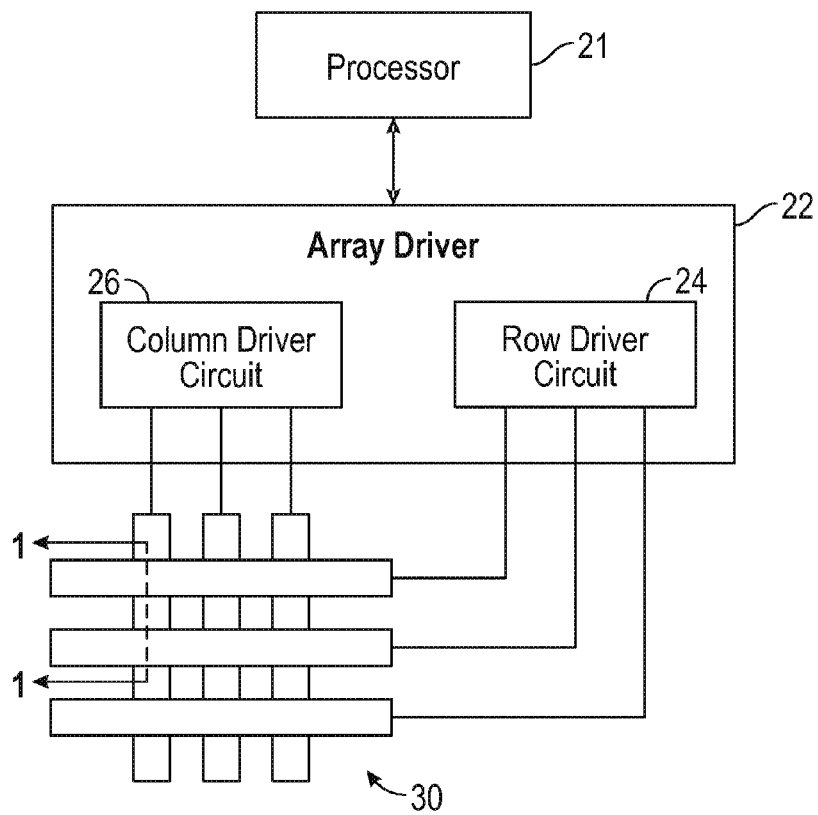
FIG. 8 is a system block diagram illustrating an electronic device incorporating an IMOD-based display including a three element by three element array of IMOD display elements.

FIG. 8 is a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 7 is shown by the lines 1-1 in FIG. 8. Although FIG. 8 illustrates a 3×3 array of IMOD display elements for the sake of clarity, the display array 30 may contain a very large number of IMOD display elements, and may have a different number of IMOD display elements in rows than in columns, and vice versa.

Figure 9A:
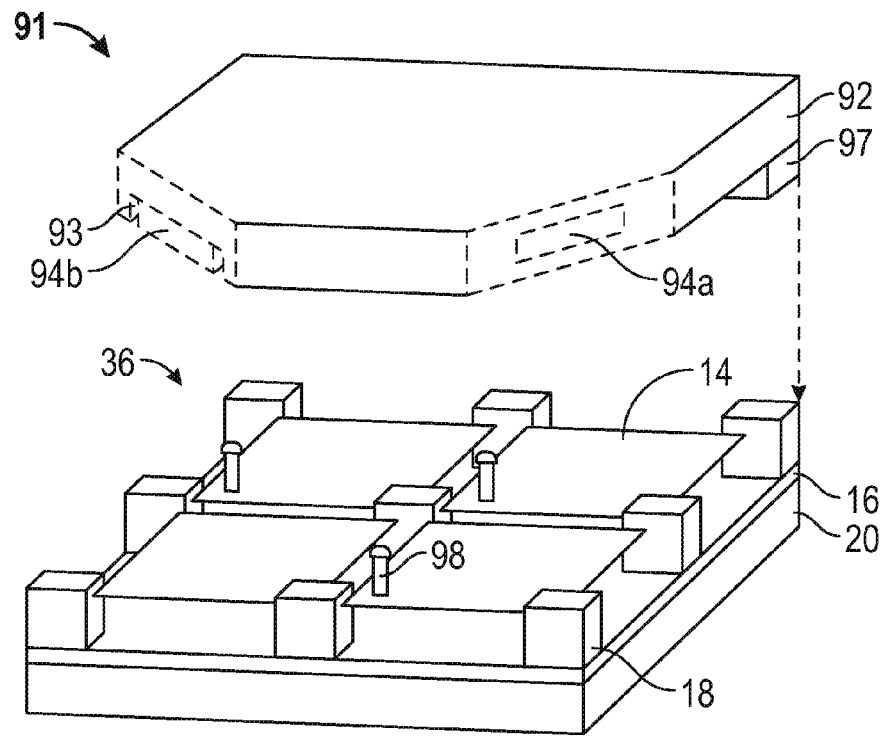
FIGS. 9A and 9B are schematic exploded partial perspective views of a portion of an electromechanical systems (EMS) package including an array of EMS elements and a backplate.
Figure 9B:
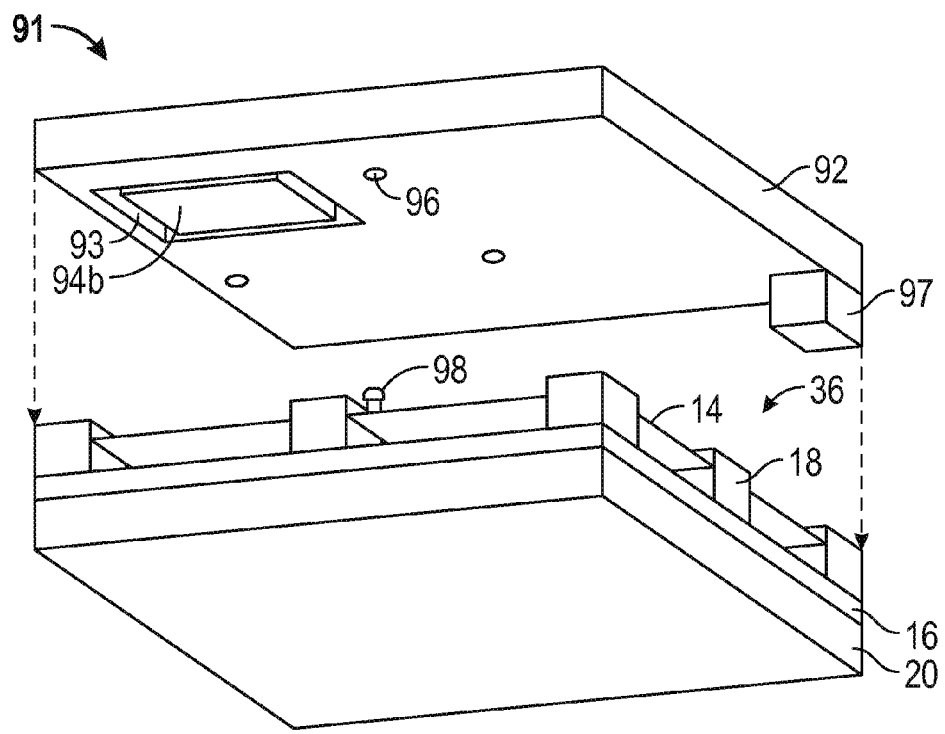

FIGS. 9A and 9B are schematic exploded partial perspective views of a portion of an EMS package 91 including an array 36 of EMS elements and a backplate 92. FIG. 9A is shown with two corners of the backplate 92 cut away to better illustrate certain portions of the backplate 92, while FIG. 9B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 9A and 9B, the backplate 92 can include one or more backplate components 94a and 94b, which can be partially or wholly embedded in the backplate 92. As can be seen in FIG. 9A, backplate component 94a is embedded in the backplate 92. As can be seen in FIGS. 9A and 9B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 9B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 9A and 9B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 9A and 9B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

Figure 10A:
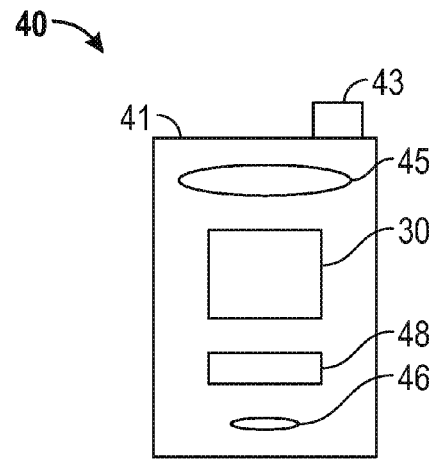
FIGS. 10A and 10B are system block diagrams illustrating a display device that includes a plurality of IMOD display elements.
Figure 10B:
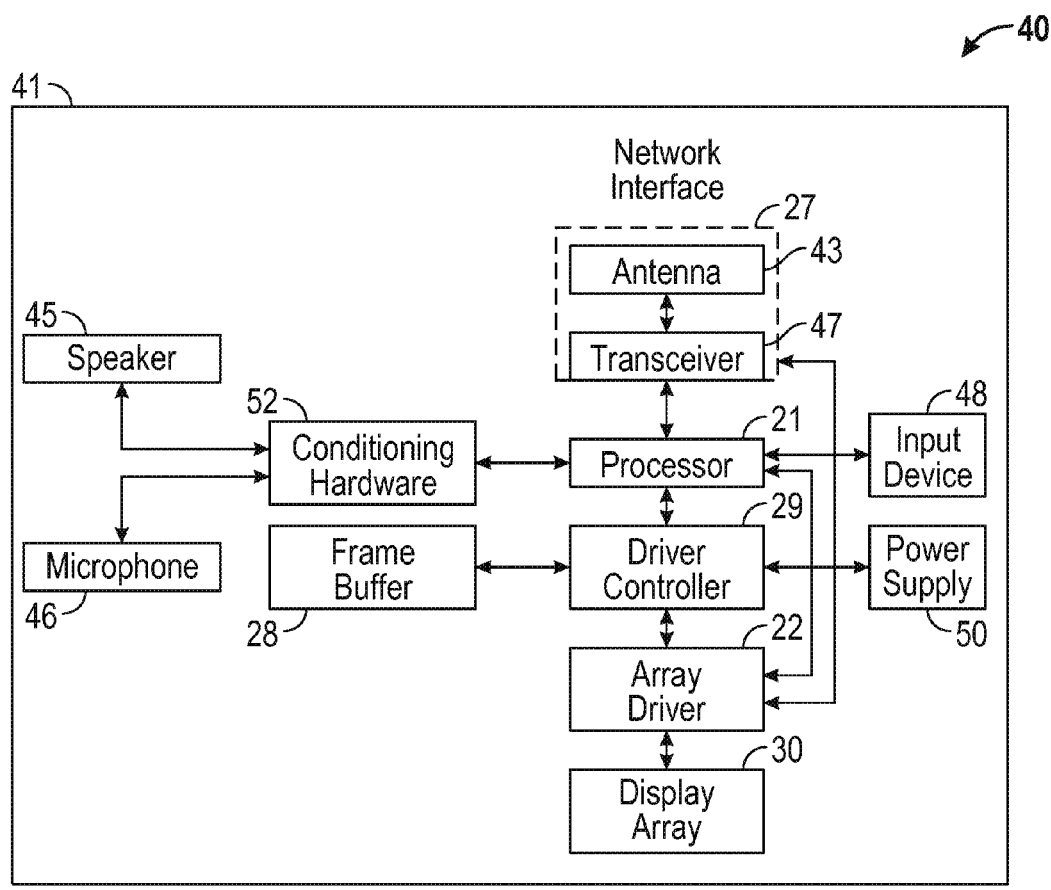

FIGS. 10A and 10B are system block diagrams illustrating a display device 40 that includes a plurality of IMOD display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 10A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 10A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An integrated passive device, comprising:
   a substrate;
   a first conductive trace over the substrate;
   a second conductive trace over the first conductive trace; and
   an interlayer dielectric between a portion of the first conductive trace and the second conductive trace to electrically isolate the first conductive trace from the second conductive trace, the interlayer dielectric having a hole, the hole being at least partially filled and defining a via to provide direct electrical connection between the conductive traces, wherein a width of the hole is greater than a width of each of the conductive traces, both widths being lateral dimensions of the device.

2. The device of claim 1, wherein the width of the hole laterally extends beyond the edges of the conductive traces.

3. The device of claim 1, wherein the second conductive trace includes copper.

4. The device of claim 1, wherein a thickness of the second conductive trace is greater than about 1 μm.

5. The device of claim 1, wherein a thickness of the interlayer dielectric is between about 1 μm and about 5 μm.

6. The device of claim 1, wherein the second conductive trace forms part of a magnetic domain passive component.

7. The device of claim 6, wherein the magnetic domain passive component is one of an inductor, transformer and a passive filter.

8. The device of claim 1, wherein the second conductive trace is directly over and in contact with at least a portion of the first conductive trace not in contact with the interlayer dielectric.

9. The device of claim 1, wherein the width of the hole is greater than five times the width of at least one of the conductive traces.

10. The device of claim 1, wherein the first conductive trace includes at least aluminum or an aluminum alloy.

11. The device of claim 1, further comprising a second interlayer dielectric over the second conductive trace, wherein the hole is at least partially filled by the second interlayer dielectric and the second conductive trace.

12. The device of claim 1, further comprising:
    a display;
    a processor that is configured to communicate with the display, the processor being configured to process image data; and
    a memory device that is configured to communicate with the processor.

13. The device of claim 12, further comprising:
    a driver circuit configured to send at least one signal to the display; and
    a controller configured to send at least a portion of the image data to the driver circuit.

14. The device of claim 12, further comprising:
    an image source module configured to send the image data to the processor, wherein the image source module includes at least one of a receiver, transceiver, and transmitter.

15. The device of claim 12, further comprising:
    an input device configured to receive input data and to communicate the input data to the processor.

16. An integrated passive device, comprising:
    a substrate;
    first means for conducting electricity, positioned over the substrate;
    second means for conducting electricity, positioned over the first conducting means;
    means for electrically isolating the first conducting means and the second conducting means, positioned between a portion of the first conducting means and the second conducting means; and
    means for providing electrical connection in the electrically isolating means between the first conducting means and the second conducting means, wherein the means for providing electrical connection is defined by a hole in the electrically isolating means, the hole being at least partially filled by the second conducting means, and wherein a width of the hole is greater than a width of each of the first conducting means and the second conducting means, both widths being lateral dimensions of the device.

17. The device of claim 16, wherein the hole has a width that laterally extends beyond the edges of each of the first conducting means and the second conducting means.

18. The device of claim 16, wherein the second conducting means includes copper.

19. The device of claim 16, wherein a thickness of the second conducting means is greater than about 1 μm.

20. The device of claim 16, wherein the second conducting means forms part of a magnetic domain passive component.

21. The device of claim 16, further comprising a sec-end means for providing electrical insulation over the second conducting means.

22. A method of manufacturing an integrated passive device, comprising:
    providing a substrate;
    depositing a first conductive trace over the substrate;
    depositing a first interlayer dielectric over the first conductive trace;
    forming a hole in the first interlayer dielectric, wherein a width of the hole is greater than a width of the first conductive trace, the hole defining a via for electrical interconnection between conductive traces;
    depositing a second conductive trace in the hole over the first conductive trace to form the via, wherein the width of the hole is greater than a width of the second conductive trace, both widths being lateral dimensions of the device; and
    depositing a second interlayer dielectric over the second conductive trace.

23. The method of claim 22, wherein forming the hole includes etching the first interlayer dielectric to expose at least a substantial portion of the first conductive trace.

24. The method of claim 23, wherein etching the first interlayer dielectric includes removing the substantial portion of the first interlayer dielectric except for one or more remaining portions of the first interlayer dielectric between the first conductive trace and the second conductive trace, wherein the one or more remaining portions of the first interlayer dielectric electrically isolate a portion of the first conductive trace from second conductive trace.

25. The method of claim 22, wherein depositing the second conductive trace and depositing the second interlayer dielectric substantially fills the hole to form the via between the conductive traces.

26. The method of claim 22, wherein depositing the second conductive trace includes electroplating copper over the first conductive trace.

27. The method of claim 22, wherein the second interlayer dielectric includes dielectric material with a thickness between about 1 μm and about 15 μm as measured from the top surface of the second conductive trace.

28. The method of claim 22, wherein the second conductive trace includes electrically conductive material with a thickness greater than about 1 μm.

29. The method of claim 22, wherein depositing the second conductive trace and the second interlayer dielectric occur under coarse process control constraints.

30. The method of claim 29, wherein depositing the second conductive trace and the second interlayer dielectric occur in a far back-end-of-line (FBEOL) process.

31. The method of claim 22, wherein depositing the first conductive trace includes depositing at least an aluminum or aluminum alloy over the substrate.

32. The method of claim 22, wherein the second conductive trace forms part of a magnetic domain passive component.

33. The method of claim 22, wherein the magnetic domain passive component is one of an inductor, transformer, or passive filter.

34. An integrated passive device produced by the method as recited by claim 22.

\* \* \* \* \*